(12) United States Patent
Fleischer et al.

(10) Patent No.: US 11,193,802 B2
(45) Date of Patent: Dec. 7, 2021

(54) SENSOR ARRANGEMENT

(71) Applicant: Robert Bosch GmbH, Stuttgart (DE)

(72) Inventors: Sven Fleischer, Oetisheim (DE);
Joachim Domat, Zaisenhausen (DE);
Robert Remus, Mundelsheim (DE);
Stephan Knackert, Haldenwang (DE);
Rainer Gumpinger, Rettenberg Altach (DE); Bernd Lutz, Kempten (DE);
Michael Rambow, Durach (DE)

(73) Assignee: Robert Bosch GmbH, Stuttgart (DE)

( * ) Notice: Subject to any disclaimer, the term of this patent is extended or adjusted under 35 U.S.C. 154(b) by 416 days.

(21) Appl. No.: 16/309,069

(22) PCT Filed: May 31, 2017

(86) PCT No.: PCT/EP2017/063152
§ 371 (c)(1),
(2) Date: Dec. 11, 2018

(87) PCT Pub. No.: WO2017/215916
PCT Pub. Date: Dec. 21, 2017

(65) Prior Publication Data
US 2020/0049536 A1 Feb. 13, 2020

(30) Foreign Application Priority Data

Jun. 14, 2016 (DE) ...................... 10 2016 210 532.9

(51) Int. Cl.
*G01D 11/24* (2006.01)
*G01D 11/30* (2006.01)
*H05K 5/06* (2006.01)

(52) U.S. Cl.
CPC ........... *G01D 11/245* (2013.01); *G01D 11/30* (2013.01); *H05K 5/06* (2013.01)

(58) Field of Classification Search
CPC ........ G01D 11/245; G01D 11/30; H05K 5/06; H01G 9/10; H01G 9/008; H01G 9/02;
(Continued)

(56) References Cited

U.S. PATENT DOCUMENTS

| 2007/0279845 A1 | 12/2007 | Kuhnt et al. |
| 2013/0015981 A1 * | 1/2013 | Franc .................... H05K 5/064 |
| | | 340/815.4 |
| 2015/0137279 A1 | 5/2015 | Tiu et al. |

FOREIGN PATENT DOCUMENTS

| DE | 92 10 480.0 U1 | 11/1992 |
| DE | 196 18 631 A1 | 11/1997 |

(Continued)

OTHER PUBLICATIONS

International Search Report corresponding to PCT Application No. PCT/EP2017/063152, dated Aug. 31, 2017 (German and English language document) (5 pages).

*Primary Examiner* — Michael P McFadden
(74) *Attorney, Agent, or Firm* — Maginot, Moore & Beck LLP

(57) ABSTRACT

A sensor arrangement includes a support component, a sensor element with at least two terminals, at least two plug contacts and at least two connection elements. The at least two connection elements are configured for electrically connecting the terminals to the control contacts. An inner chamber of the support component is filled with a sealing compound which forms a seal around at least the sensor element and the terminals, the plug contacts at least on the contacting region of the connection elements, and the connection elements. The sealing mass is covered at least partially with a film.

12 Claims, 8 Drawing Sheets

(58) Field of Classification Search
CPC . H01G 9/045; H01G 9/145; H01G 2009/0408
See application file for complete search history.

(56) References Cited

FOREIGN PATENT DOCUMENTS

| | | | |
|---|---|---|---|
| DE | 197 55 765 A1 | 6/1999 | |
| DE | 10 2004 033 475 A1 | 8/2005 | |
| DE | 10 2009 028 963 A1 | 3/2011 | |
| DE | 10 2009 046 439 A1 | 5/2011 | |
| DE | 20 2008 018 152 U1 | 3/2012 | |
| DE | 10 2013 206 689 A1 | 10/2014 | |
| DE | 20 2014 002 881 U1 | 8/2015 | |
| DE | 10 2014 225 856 A1 | 6/2016 | |
| EP | 1 446 643 B1 | 8/2004 | |
| EP | 2 690 412 A1 | 1/2014 | |
| EP | 2690412 A1 * | 1/2014 | ........... H03K 17/955 |
| JP | S57-006042 U1 | 1/1982 | |
| JP | 2007-532865 A | 11/2007 | |
| WO | 2005/075953 A1 | 8/2005 | |

\* cited by examiner

SENSOR ARRANGEMENT

This application is a 35 U.S.C. § 371 National Stage Application of PCT/EP2017/063,152, filed on May 31, 2017, which claims the benefit of priority to Serial No. DE 10 2016 210 532.9, filed on Jun. 14, 2016 in Germany, the disclosures of which are incorporated herein by reference in their entirety.

BACKGROUND

Published patent application DE 10 2009 028 963 discloses a connector arrangement for a sensor arrangement having a connector element, which, in a first contact-connection region, is electrically and mechanically connected to an end of at least one conductor of a connector cable and, in a second contact-connection region, can be electrically and mechanically connected to a sensor element. The connector element is in this case at least partly encased by a plastic overmold.

SUMMARY

The sensor arrangement according to the disclosure comprises a holder component, a sensor element having at least two connector elements, at least two plug contacts, and at least two connecting elements for the electrical connection of the connector elements to the plug contacts. The interior of the holder component is filled with a sealing compound, which encloses in sealing fashion at least the sensor element having the connector elements, the plug contacts at least at a contact-connection region with respect to the connecting elements, and the connecting elements. The sealing compound is at least partially covered by means of a film. Covering the sealing compound, which surrounds and seals the elements built into the sensor, has the advantage that the sealing compound is protected against environmental influences. A sensor arrangement of this kind can be used as a wheel rotational-speed sensor of a motor vehicle, which sensor can be exposed in the region of the wheels of a vehicle to dirt and moisture, as is known. Partial covering further ensures that thermal expansion of the sealing compound lead to an increase in pressure in the intermediate space between the film and the sealing compound, which may lead to flaking of the film.

In an advantageous configuration, the film can be fastened to the holder component. The film can be fastened to the holder component, for example, by way of welding or adhesive bonding. This leads to a secure connection between the film and the holder component, which reinforces the durability and stability of the sensor arrangement.

In an advantageous configuration, the holder component is trough-shaped and has an opening. The sealing compound can reach the interior of the holder component through said opening. The film is advantageously fastened, in particular welded or adhesively bonded, at least partially along the circumference of the opening. If the holder component provided with sealing compound is present, the mounting and securing of the film can be performed through simple application of the film at the edge of the opening, since the edge of the opening is directly accessible.

In one configuration of the disclosure, the sealing compound is partially covered by virtue of a part of the opening of the holder component being left free when the film is applied. As already described, this has the advantage that an undesired build-up of pressure between the film and the sealing compound can be prevented. As a result of the fact that the partial covering—or in other words leaving a region free—takes place when the film is applied, this can be achieved in few working steps.

In one configuration of the sensor arrangement, the part of the opening of the holder component that is left free is provided on an edge of the opening of the holder component. In this configuration, the region that is left free can be achieved by virtue of a film with smaller dimensions than the opening of the holder component being applied. Through the simple application of a film whose length is smaller than the length of the opening, one region remains directly free. Thus, in one working step, the covering—and as a result the protection—is provided and the opening is generated at the same time.

In an alternative configuration, the part of the opening of the holder component that is left free is located within and remote from the edge of the opening of the holder component. "Within the opening" can be understood to mean that the film has a hole, which is located in the film but does not make contact with the edge. If a film of this kind is used, an opening is produced toward the sealing compound, which is located remotely from the edge, that is to say within the film. In this case, too, in a step of applying the film to the holder component, the protective function of the film and the penetrability of the opening on the holder component can be provided in a simple manner.

The film is advantageously fastened to the holder component in such a way that the bottom side of the film is spaced apart from the surface of the sealing compound. This can prevent air inclusions being able to form between the film and the sealing compound in the case of a film bearing against the sealing compound, which air inclusions can again lead to flaking of the film, as already described.

The spacing of the bottom side of the film from the top side of the sealing compound depends here on a degree of filling of the interior of the holder component with sealing compound. In this way, when the sealing compound is introduced into the interior of the holder component, it is possible to adjust the spacing easily by virtue of the correct amount of sealing compound being used.

DETAILED DESCRIPTION

Figure 1:
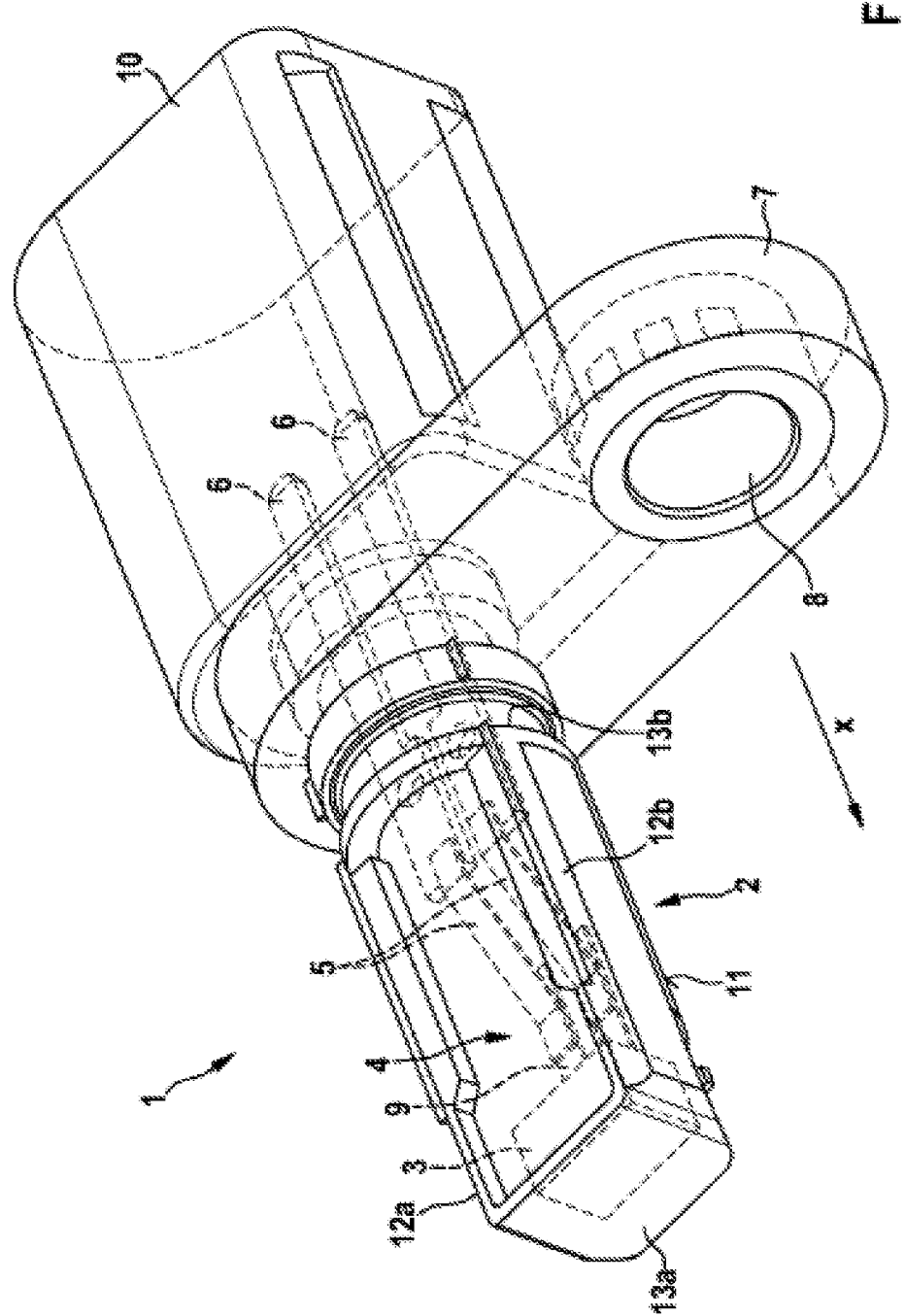
FIG. 1 shows a sensor apparatus.

One embodiment of the disclosure is shown in FIG. 1. The sensor 1 comprises a holder 2, a fastening component 7 and a plug housing 10.

The plug housing 10 can receive a connector cable (not shown), which transmits sensor signals of the sensor 1 to other electronic components. The geometry of the plug housing can be adapted accordingly to the cable geometry.

The fastening component 7 serves to fasten the sensor to further components. To this end, the fastening component can be present in the form of a lug 7, which has a bushing 8. A fastening element (not shown), for example a screw or a bolt, can be passed through the bushing 8 in order to secure the fastening of the sensor 1 to further components in a known manner.

The sensor 1 furthermore comprises a holder 2. The holder is in the form of a trough. The trough shape of the holder 2 is formed by a base 11, two side walls 12a, 12b, a front wall 13a and a rear wall 13b.

The base 11, the side walls 12a, 12b, the front wall 13a and the rear wall 13b delimit an interior 4 of the holder 2.

The holder 2 can receive at least one sensor element 3. The actual measurement values of the sensor 1 are captured by means of such a sensor element 3. A sensor element 3 can be understood to mean, for example, an ASIC. The sensor element 3 in this case has at least one connector contact 9 for the electrical contact-connection of the sensor element 3. The holder 2 can have a positioning structure, which makes it possible to receive the sensor element 3 in the holder 2. Such a positioning structure can be designed as an—at least partial—complement to the sensor element 3 and can receive same with precise fitting. The positioning structure can receive the sensor element 3 and/or the at least one connector contact 9 along the respective circumference.

Sensor signals of the sensor 1, more precisely of the sensor element 3, have to be able to be conducted away therefrom and reach the plug component 10, where the sensor signals are passed on.

The sensor 1 has at least one plug pin 6, which can lead electrical signals from the interior 4 of the holder 2 through the rear wall 13b. Such a plug pin 6 consists of a conductive material.

The plug pin 6 penetrates the rear wall 13b of the holder.

Figure 5:
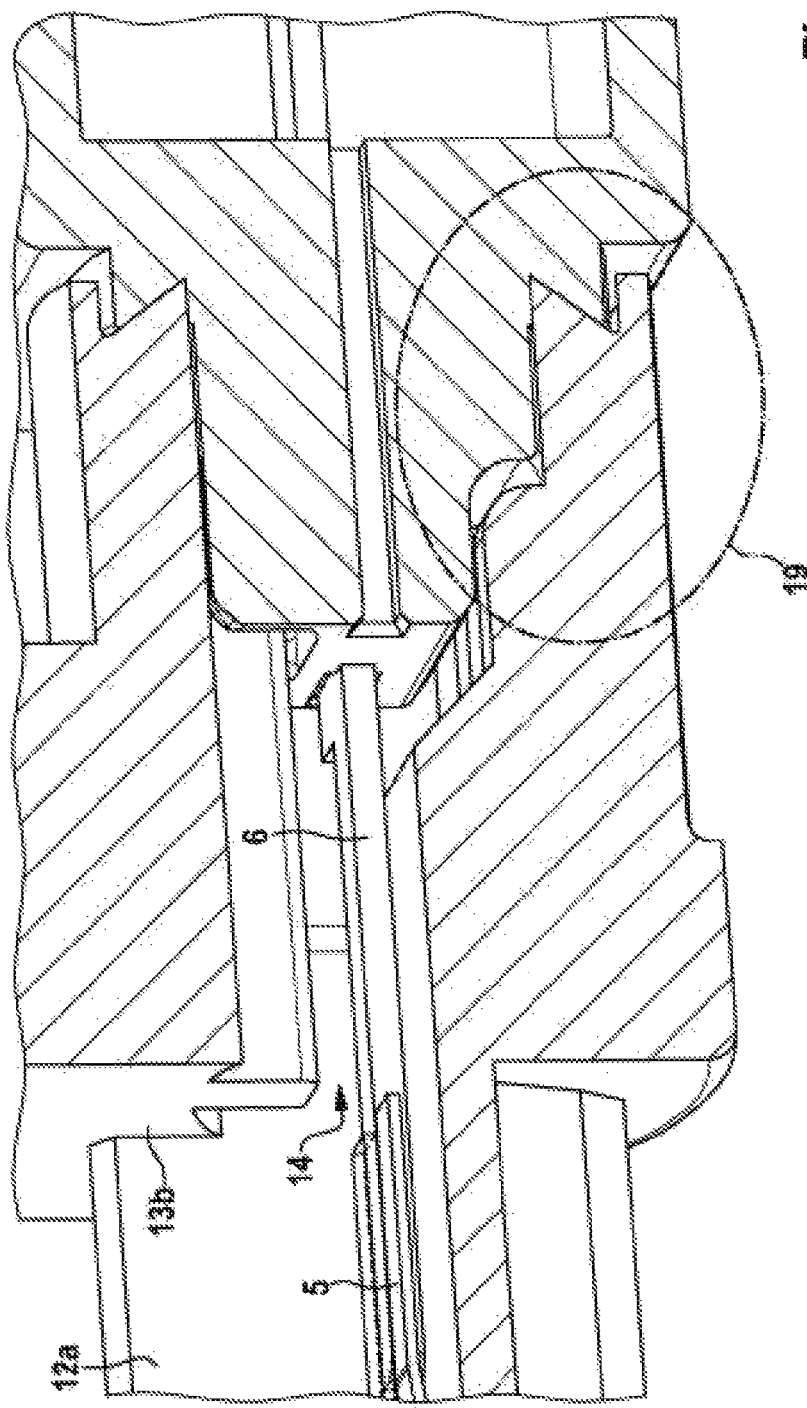
FIG. 5 shows a cross section of a further part of the sensor apparatus.

One possibility for penetrating the rear wall 13b is also illustrated in FIG. 5. The rear wall 13b has an opening 14, through which a plug pin 6 is led from outside of the holder 2 into the interior 4 of the holder 2.

The plug pin 6 can simultaneously produce the contact for the connector cable in the plug component 10.

To connect the sensor element 3, more precisely the connector contact 9 of the sensor element 3, to the plug pin 6, the sensor 1 provides at least one conductor ribbon 5, which electrically conductively connects the connector contact 9 and the plug pin 6. The conductor ribbon 5 is provided from an electrically conductive material. The respective ends of the conductor ribbon 5 are conductively contact-connected and secured on the one side to the plug pin 6 and on the other side to the connector contact 9 of the sensor element 3.

Figure 2:
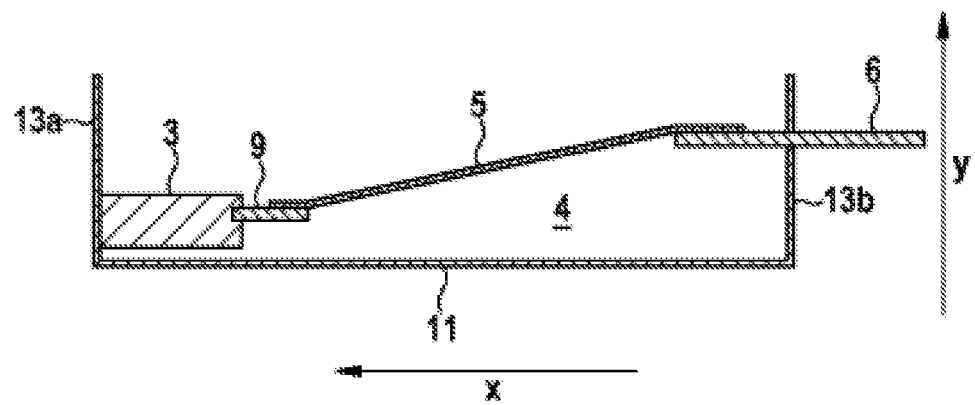
FIG. 2 shows a cross section of a sensor apparatus.
Figure 3:
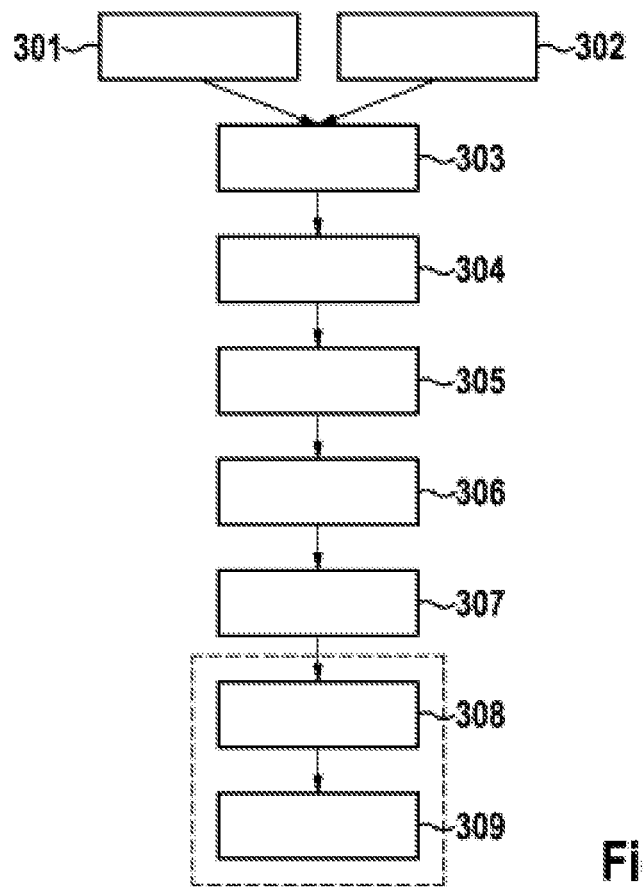
FIG. 3 shows a flow chart of a production method.

FIG. 2 shows a cross section of the holder 2 in the direction of the line indicated in FIG. 1 as x. Identical elements are indicated in FIG. 2 by identical reference signs.

There may be an offset present between the connector contact 9 and the plug pin 6. Such an offset can be present in the direction indicated by y in FIG. 2.

In the case illustrated in FIG. 2, the plug pin 6 is arranged in a manner offset upward with respect to the connector contact 9. The electrical connection between the connector contact 9 and the plug pin 6 has to balance such an offset.

The conductor ribbon 5 is of elastic form. Elastic is to be understood to mean that the conductor ribbon 5 is not a rigid component but instead can be deformed. The deformable conductor ribbon 5 can be adapted to the present offset between the connector contact 9 and the plug pin 6. If a conductor ribbon 5 in the correct length and flexibility to the present sensor geometry is used, a present offset can be easily balanced thereby. One possible material for this is a copper alloy, for example CuSn6. In an alternative designation, the conductor ribbon 5 can also be referred to as flexible.

In the previous depictions, reference has been made to only one plug pin 6, one conductor ribbon 5 and/or one connector contact 9 for the sake of simplicity. As can be seen in FIG. 1, however, generally at least one of these elements is present, in particular two connector contacts 9, two plug pins 6 and two conductor ribbons 5.

Figure 4:
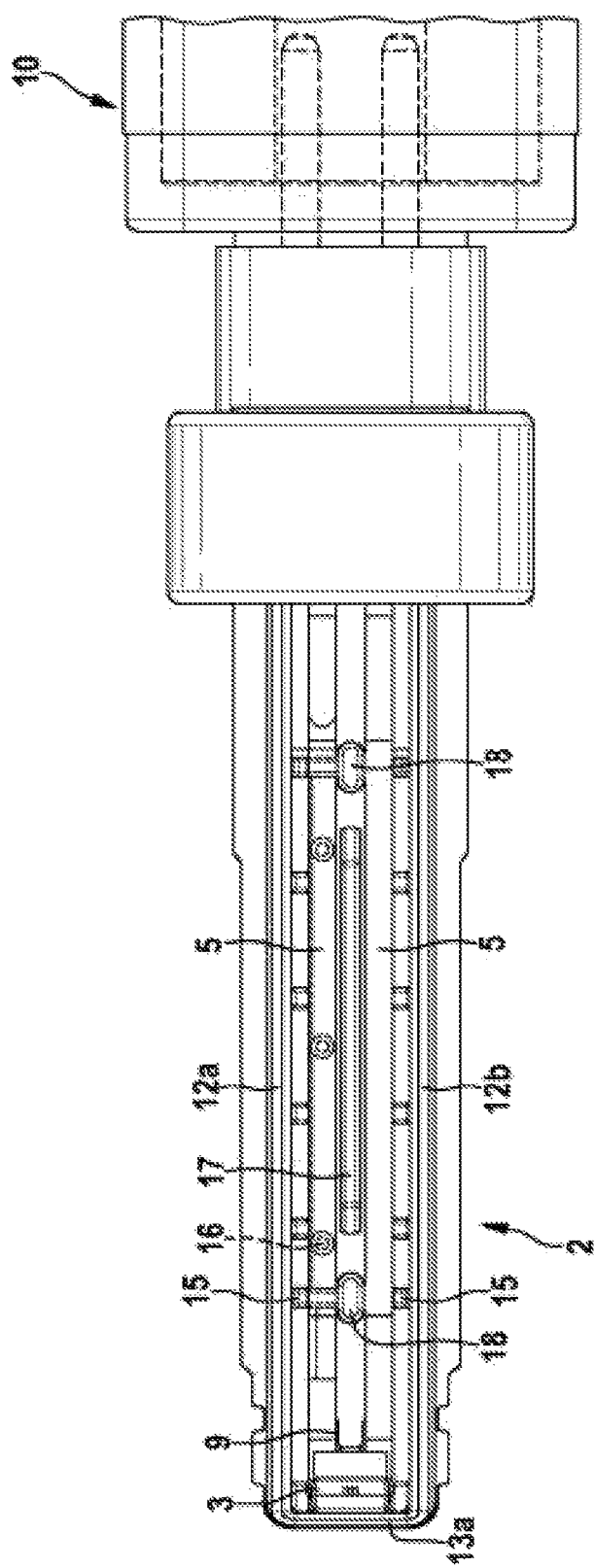
FIG. 4 shows a top view of a part of the sensor apparatus.

FIG. 4 shows a view of the sensor 1 from above. The conductor ribbons 5 connect the connector contacts 9 of the sensor element 3 to the plug pins 6. The conductor ribbons 5 run in the interior 4 of the holder 2 and balance an offset between the plug pins 6 and the connector contacts 9.

The holder 2 has course aids, which ensure a desired course of the conductor ribbons 5 in the interior 4 of the holder 2.

At least one bearing point 15 is located in each case on the side walls 12a, 12b of the holder. The bearing point 15 serves to space at least one conductor ribbon 5 apart from the respective adjacent side wall 12a or 12b. A bearing point 15 has an extent in height of the holder 2—corresponding to the y direction from FIG. 2. Said bearing point prevents a conductor ribbon 5 from coming too close to the side wall 12a, 12b of the holder 2. The extent in the y direction of the holder 2 of the bearing point 15 can in this case be adapted to the respective present height of the course of the conductor ribbon 5 over the base 11 of the holder 2, since, as described, the conductor ribbon 5 can balance an offset in the y direction between the connector contact 9 and the plug pin 6 and can therefore change its height along its course in the interior 4 of the holder 2.

The holder 2 also has at least one mandrel 18, which is arranged in the center of the holder. The mandrel 18 also has a sufficient extension in the y direction as already described in the case of the bearing points 15.

A spatial isolation of two conductor ribbons 5 can be ensured by means of the mandrel 18. Isolation of the conductor ribbons is necessary to prevent an electrical short between the conductor ribbons 5.

The mandrel 18 can be deformed to secure the conductor ribbons 5 in the holder 2. A deformation is to be understood to mean that the mandrel 18 is enlarged in terms of its dimensions in an upper region apart from the base 11 of the holder 2. In the case of enlargement of the dimensions, a covering of the conductor ribbons 5 is created by the mandrel 18. Due to the covering, the conductor ribbon 5 is pressed against a corresponding support face and secured thereby. A corresponding support face can be, for example, a support point 16 described further below or a similar structure, which is formed on at least one wall 11, 12a, 12b of the holder 2.

As an alternative or in addition to at least one mandrel 18, a partition wall 17 can also be provided between two conductor ribbons 5. A partition wall 17 also has to have a sufficient extension in the y direction of the holder 2 in order to ensure an isolation of the conductor ribbons 5.

The holder can also have at least one support point 16 per conductor ribbon 5, which support points ensure spacing of the respective conductor ribbon 5 apart from the base 11 of the holder 2.

The support points 16 per conductor ribbon can have a non-planar surface at the top end—facing away from the base 11 of the holder 2. A non-planar surface can be a point, a pyramid or a rounded face.

The bearing points 15, support points 16, the mandrels 18 and, where applicable, the partition wall 17 can be understood as separators. The separators make it possible to space the conductor ribbons 5 present in the sensor 1 apart from respective adjacent elements, for example from a further conductor ribbon 5, an adjacent wall 12*a*, 12*b*, or from the base 11.

As described further below, the production of the sensor 1 comprises sealing of the interior 4 by way of filling same with a filling compound, for example with silicone. If the conductor ribbons are present in a manner spaced apart from the other elements such as the further conductor ribbon 5, an adjacent wall 12*a*, 12*b*, or from the base 11, it is thus ensured that the filling compound seals the interior 4 sufficiently optimally. By spacing the conductor ribbon 5 apart from the base 11, the region therebetween can thus be achieved easily with filling compound. The smallest possible support face can likewise be ensured by way of a point, pyramid or rounding at the top side of the support point 16 against which the conductor ribbon 5 bears, in order to achieve the greatest possible contact between the conductor ribbon 5 and the surrounding silicone, and consequently to optimize the sealing function.

The sensor 1 according to the disclosure is produced by means of a production method according to the disclosure. One embodiment of the production method is described in the following text.

The holder 2 is formed in a first step 301. The holder two is produced as an injection-molded component. The holder 2 in this case also has a passage opening 14, as can be seen in FIG. 5, through which the plug pins 6 can reach the interior 4. In the interior 4, the plug pins 6 are conductively connected to the conductor ribbons 5, and consequently also to the connector contacts 9 of the sensor element 3. After this production step, the holder 2 also has the necessary separators, that is to say the bearing points 15, support points 16, the mandrels 18 and, where applicable, also the partition wall 17. It must be pointed out that the precise configuration of the separators, in particular the number, positioning or embodiment thereof (for example as a mandrel 18 and/or wall 17) may vary.

The passage opening 14 of the holder 2 shown in FIG. 5 can also have an extent in the direction of the plug pin led through, which extent is larger than is necessary in order to slide the plug pins in through the passage opening. In this way, silicone compound, that is to say filling compound, from the interior 4 can also reach the region in which the plug pins are led through the rear wall 13*b* of the holder 2.

The plug 10 is formed in a further step 302. The plug is formed in step 302 by virtue of a housing the plug pins 6 being connected to a housing. The plug pins 6 can in this case be pressed into a preformed opening of the housing. It is likewise possible to injection-mold the plug pins 6 in an injection-molding process so that the housing of the plug 10 receives and secures the plug pins 6.

The holder 2 and the plug 10 together with the plug pins form two intermediate components in the production method.

The two intermediate components 2, 10—the plug 10 having the plug pins 6 and the holder 2—are plugged together in a step 303.

When the holder 2 and the plug 10 are plugged together, the at least one plug pin 6 is pushed through the rear wall 13*b* of the holder 2. The pin 6 consequently reaches the interior 4 of the holder 2. As already depicted, the holder 2 has an opening 14 for this purpose, which opening can be seen in FIG. 5. During plugging together, it can be provided that complementary structures of the plug 10 and of the holder 2 can enter into engagement with one another. In this way, the mechanical strength of the connection of the two components to one another can be increased. Such engagement is highlighted by way of example in FIG. 5 as an engagement region 19. It may be important to position the plug 10 and the holder 2 in a certain preferred orientation with respect to one another. Said preferred orientation can also be achieved by way of a corresponding complementary structure of the two intermediate components 2 and 10. A complementary structure can be provided, for example, in the form of a groove and tongue structure. It is likewise conceivable that the components—holder 2 and plug 10—are latched with respect to one another.

The intermediate components—holder 2 and plug 10—are connected to one another in a subsequent step 304. This can take place by means of ultrasonic welding. Use of other connecting technologies is possible.

The actual sensor element 3 is inserted into the holder 2 in a further step 305, wherein the sensor element 3 has the connector contacts 9 already mentioned.

In the present intermediate state after the connection of the plug 10 to the holder 2 and after the insertion of the sensor element 3 into the holder 2, the respective ends of the plug pins 6 and of the connector contacts 9 are now located in the interior 4 of the holder 2, but these are not yet electrically contact-connected.

For the electrical contact-connection of the connector contacts 9 to the respective plug pins 6, the conductor ribbons 5 are placed in the holder 2 in method step 306 by virtue of them being introduced, in particular being inserted, at the appropriate length. In this case, the correct spacing apart from the side walls 12*a*, 12*b*, the base 11 and the conductor ribbons 5 with respect to one another takes place by means of the separators 15, 16, 17 and/or 18. The contact-connection is completed by virtue of the conductor ribbons 5 being welded in a manufacturing step 307 ribbons to the connector contacts 9 and to the plug pins 6.

In a subsequent step 308, the interior 4 is filled with filling compound in order to seal said interior. This can take place using silicone.

Figure 6:
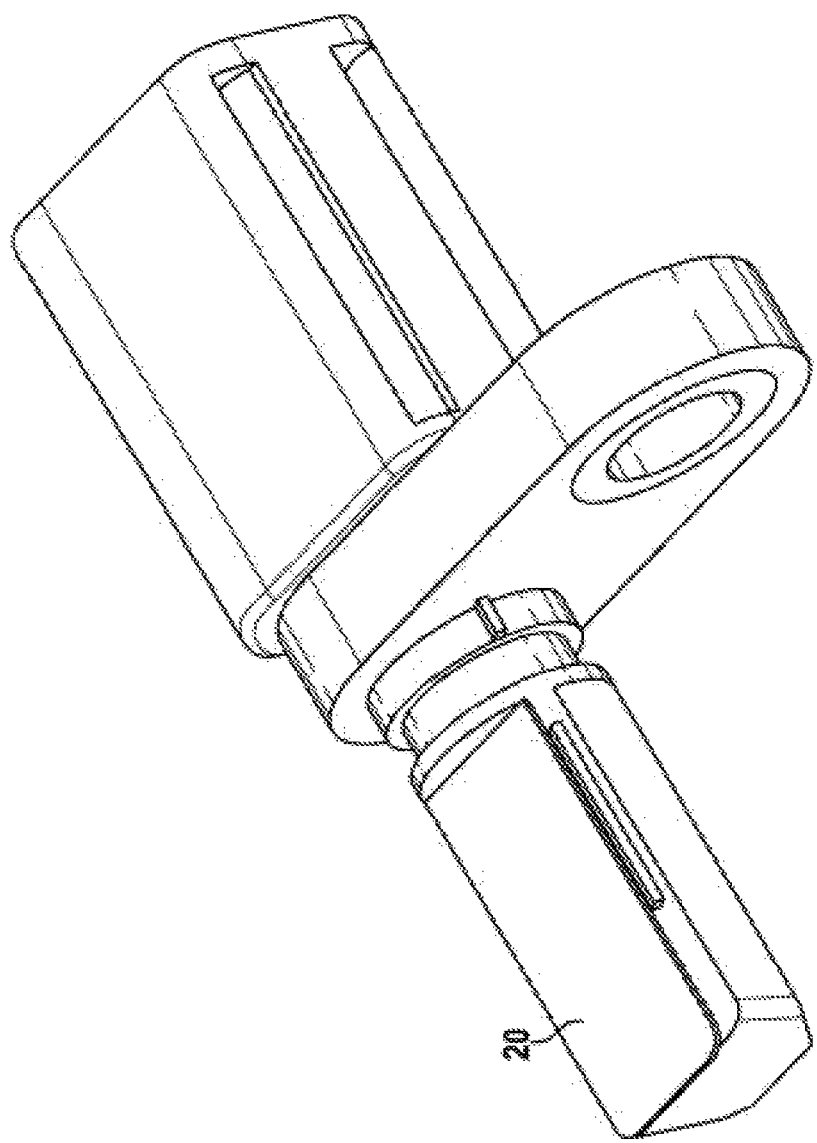
FIG. 6 shows a sensor apparatus having a covering in the form of a film.

In a subsequent step 309, a covering 20 can be applied to the holder 2 in order to cover the interior 4, which is at least partially filled with silicone. FIG. 6 shows a sensor 1, which has a covering 20 as described in step 309. Such a covering 20 protects the sensor, in particular the filling compound—in this example the silicone—against weather influences such as dirt or water and against mechanical effects, which could damage the filling compound and consequently could reduce the sealing function thereof. Such a covering 20 can be applied in the form of a film. Such a film can be secured on the holder 2, for example, by way of ultrasonic welding or by adhesive bonding.

The holder 2 can be described as trough-shaped. The film 20 can be fastened to the trough edge. Fastening to the trough edge can take place by way of welding. Fastening to only one part of the trough edge is likewise conceivable. A trough edge can be understood to mean that part of the holder that runs along the circumference around the opening of the holder 2.

Figure 7:
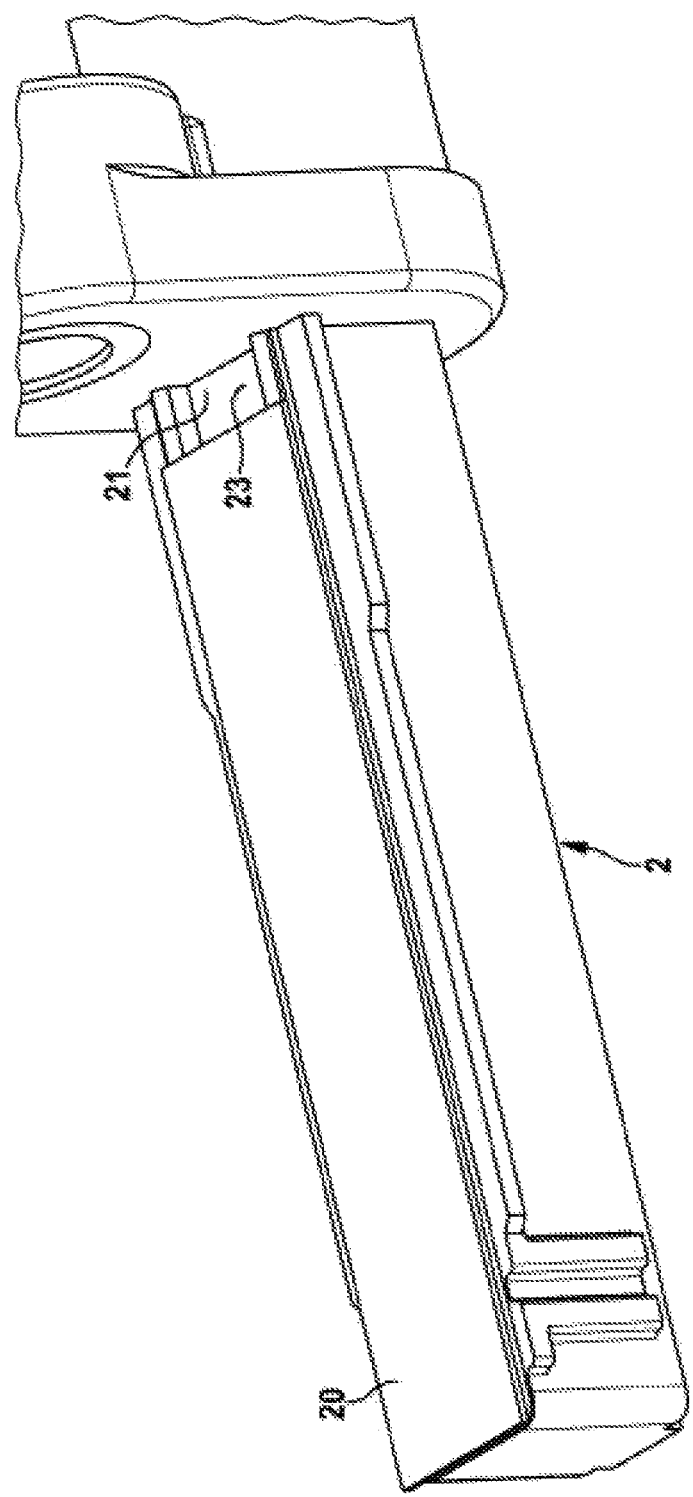
FIG. 7 shows a part of a sensor apparatus having an applied film.

FIG. 7 shows a detail that can be provided when the film is applied.

As can be seen, the film 20 only partially covers the holder 2. As illustrated in FIG. 7, an edge region 21 of the opening of the holder 2 is left uncovered during production. The sealing compound 23 is indicated in FIG. 7. Some of the sealing compound 23 remains uncovered by the film 20. In other words, it is possible to say that a gap 21, or an opening 21, is left free when the film 20 is applied to the holder 2.

Figure 8:
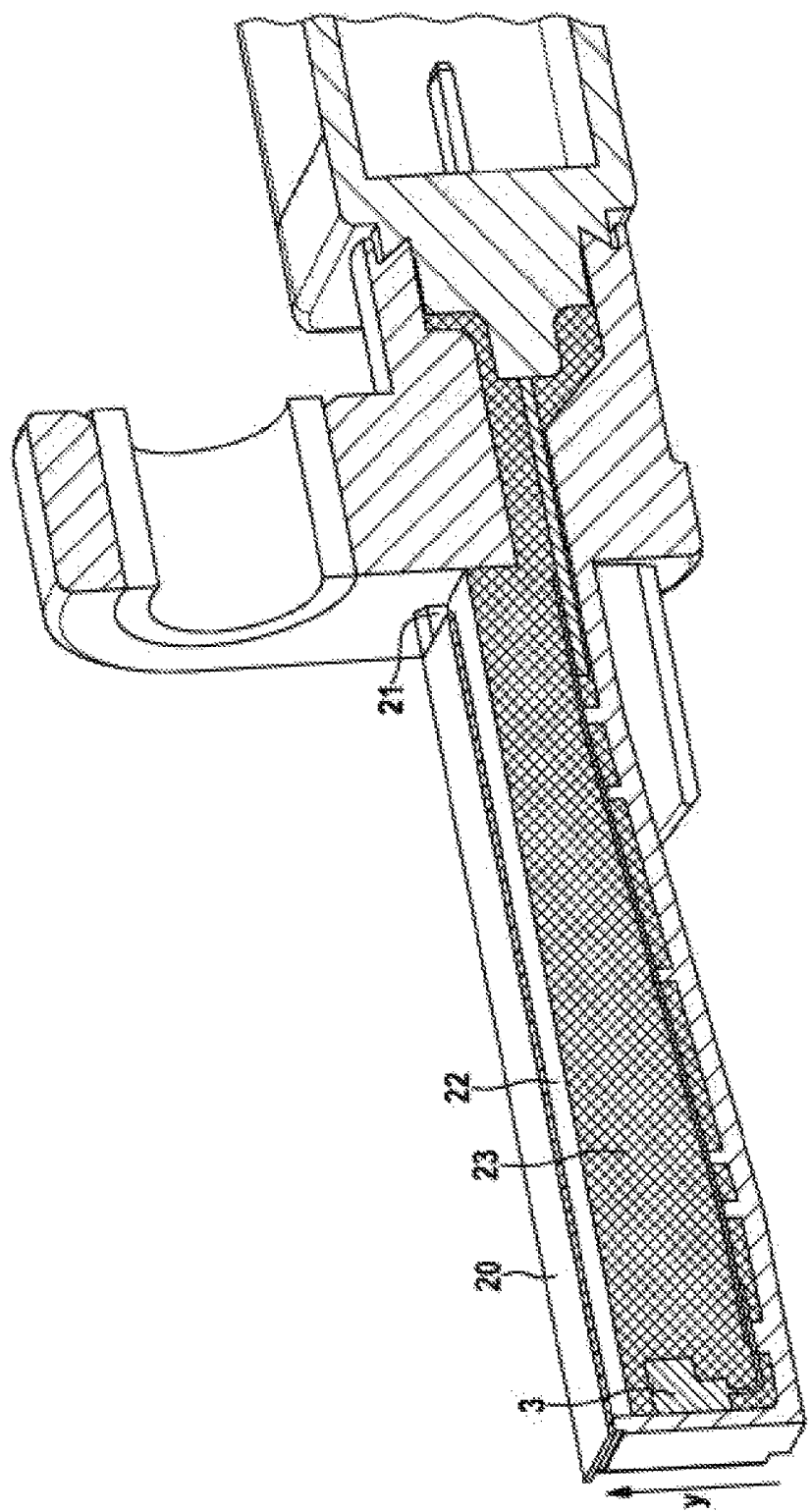
FIG. 8 shows a cross section of the sensor apparatus having an applied film.

FIG. 8 shows a cross section of the sensor apparatus 1 in the plane x-y as shown in FIG. 2.

The sealing compound 23 can also be seen here, which sealing compound has been introduced into the holder 2 and—as described—surrounds and seals the sensor element 3 having the connector contacts 9, the current ribbons 5 and the plug pins 6. The gap 21 shown in FIG. 7 can likewise be seen.

Furthermore, provision can be made for the filling with sealing compound 23 to not be performed up to the top rim of the holder 2. If the film 20 is applied to the holder 2, a free space 22 is provided between the surface of the sealing compound 23 and the bottom side of the applied film 20. The free space extends here between the film 20 and the sealing compound 23 in the direction denoted in FIG. 8 by y.

Figure 9:
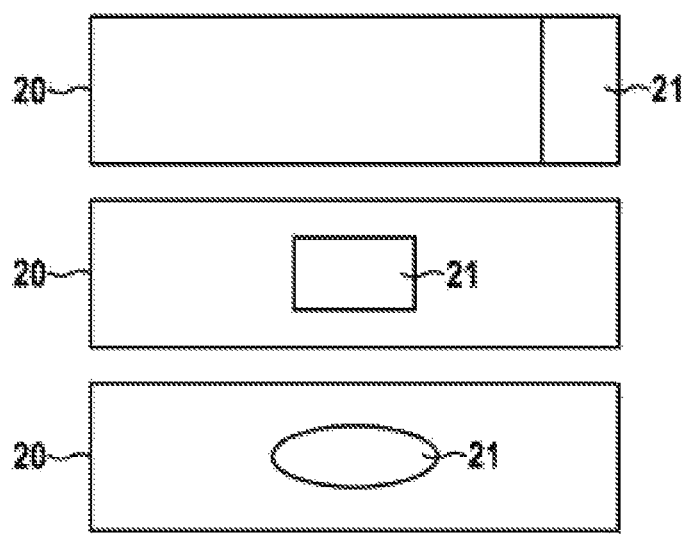
FIG. 9 shows a plurality of examples of an opening in a film.

FIG. 9 shows different possible designs of the film 20 that differ in terms of the location of the region 21 of the opening of the holder 2 that is left free when the film 20 is applied to the holder 2.

The topmost example corresponds here to the variants of the film 20 shown in FIGS. 7 and 8, wherein a gap 21 is left free when the film 20 is applied. Some of the sealing compound 23 remains uncovered in this case. The extension of the applied film (20) is shorter in one direction than the extension of the opening of the holder 2 in this direction.

In the second—middle—example in FIG. 9, the region 21 left free is produced by way of a hole in the center of the film (20). If the film 20 is applied to the holder 2, a region 21 remote from an edge of the opening of the holder 2 remains uncovered.

In the bottom variant, the opening 21 is illustrated as elliptical. Of course, other designs and positionings of the region 21 left free are conceivable when a corresponding film 20 is applied to the holder 2.

A larger or smaller opening 21 at the edge of the opening of the holder 2 can thus be achieved by virtue of the extension of the film 20 being selected accordingly. It is likewise possible to achieve the size, position or shape of the region 21 of the opening of the holder 2 left free and remote from the edge by way of a corresponding hole in the film 20.

In FIG. 9, for the sake of simplicity, the designs of the film with a hole/in a shortened form are likewise provided with the reference sign 21 since these designs lead to the regions 21 left free, as described, when the film 20 is applied.

By providing an opening 21 in the film 20, or at the edge of the film 20 in the form of a shortened film, it is possible to prevent a build-up of pressure from arising between the film 20 and the sealing compound 23. A build-up of pressure, for example upon expansion of the silicone as sealing compound 23, can lead to the film 20 detaching from the holder 2, for example by virtue of it flaking off. The opening 21 makes an open system possible, in which the region between the film 20 and the sealing compound 23 can communicate with the region outside of the holder 2. "Communicate" can be understood to mean an exchange of media, which, for example, makes exchange in liquid and/or gaseous form possible.

The gap 22 between the sealing compound 23 and the film 20 serves to ensure a spacing between the silicone and the film. A sufficient spacing in the height direction y of the holder 2 guarantees that the film 20 does not come into contact with the sealing compound 23. As a result thereof, the sealing compound 23 can expand without the film 20 detaching or flaking off.

Further manufacturing steps are not described in more detail but are possible, such as, for example, the application of a fastening component 7 having a bushing 8 or else the additional introduction of a magnet into the holder 2, which may be necessary depending on the measurement principle used (Hall effect, AMR, GMR).

The sensor 1 described here has been described in this embodiment as rectangular, with a front wall, rear wall, side wall and base, and corresponding separators and openings. Other geometric shapes are also possible, wherein the elements can then be assigned analogously. A cylindrical sensor also has, for example, a side face, and a front wall and rear wall. Only the positioning of the separators has to be adapted, where applicable.

The invention claimed is:

1. A sensor arrangement, comprising:
   a holder component defining an interior and a holder opening that opens into the interior;
   a sensor element including at least two connector elements;
   at least two plug contacts; and
   at least two connecting elements configured to electrically connect the at least two connector elements to the at least two plug contacts,
   wherein the interior of the holder component is filled with a sealing compound,
   wherein the sealing compound encloses, in sealing fashion, at least the sensor element including the at least two connector elements, the at least two plug contacts at least at a contact-connection region with respect to the at least two connecting elements, and the at least two connecting elements, and
   wherein the sealing compound is partially covered by a film fastened to the holder component at least partially along a circumference of the holder opening, the film defining a film opening that is left free of the film and is located within and remote from an edge of the holder opening.

2. The sensor arrangement as claimed in claim 1, wherein the holder component is trough-shaped.

3. The sensor arrangement as claimed in claim 2, wherein the film is welded to the holder component at least partially along the circumference of the holder opening.

4. The sensor arrangement as claimed in claim 1, wherein film opening is configured as a hole.

5. The sensor arrangement as claimed in claim 1, wherein that the film is welded or adhesively bonded to the holder component.

6. A sensor arrangement, comprising:
   a holder component defining an interior and a holder opening that opens into the interior;
   a sensor element including at least two connector elements;
   at least two plug contacts; and
   at least two connecting elements configured to electrically connect the at least two connector elements to the at least two plug contacts,
   wherein the interior of the holder component is filled with a sealing compound,
   wherein the sealing compound encloses, in sealing fashion, at least the sensor element including the at least two connector elements, the at least two plug contacts at least at a contact-connection region with respect to the at least two connecting elements, and the at least two connecting elements,
   wherein the sealing compound is partially covered by a film fastened to the holder component at least partially along a circumference of the holder opening, the film defining a film opening that is left uncovered by the film, and wherein the film opening is arranged at an edge region of the holder opening.

7. The sensor arrangement as claimed in claim 6, wherein a film extension of the film in a first direction is shorter than an opening extension of the holder opening in the first direction.

8. The sensor arrangement as claimed in claim 6, wherein:

the holder component has a first end and a second end, the film is fastened to the holder at the first end and extends across the holder opening toward the second end, and the film opening is arranged at the second end of the holder component.

9. A sensor arrangement, comprising:

a holder component defining an interior and a holder opening that opens into the interior;

a sensor element including at least two connector elements;

at least two plug contacts; and at least two connecting elements configured to electrically connect the at least two connector elements to the at least two plug contacts, wherein the interior of the holder component is filled with a sealing compound, wherein the sealing compound encloses, in sealing fashion, at least the sensor element including the at least two connector elements, the at least two plug contacts at least at a contact-connection region with respect to the at least two connecting elements, and the at least two connecting elements, and wherein the sealing compound is at least partially covered by a film fastened to the holder component such that a bottom side of the film is spaced apart from a surface of the sealing compound.

10. The sensor arrangement as claimed in claim 9, wherein the holder component defines a holder opening that opens into the interior, and the film is fastened at least partially along a circumference of the holder opening and defines a film opening that left free of the film.

11. The sensor arrangement as claimed in claim 10, wherein the film opening is located within and remote from an edge of the holder opening.

12. The sensor arrangement as claimed in claim 9, wherein the spacing of the bottom side of the film from the surface of the sealing compound depends on a degree of filling of the interior of the holder component with sealing compound.

* * * * *